United States Patent
Eastty

[11] Patent Number: 6,021,204
[45] Date of Patent: Feb. 1, 2000

[54] ANALYSIS OF AUDIO SIGNALS

[75] Inventor: Peter Charles Eastty, Oxford, United Kingdom

[73] Assignees: Sony Corporation, Tokyo, Japan; Sony United Kingdom Limited, Weybridge, United Kingdom

[21] Appl. No.: 08/947,260

[22] Filed: Oct. 8, 1997

[30] Foreign Application Priority Data

Nov. 13, 1996 [GB] United Kingdom ........... 9623635

[51] Int. Cl.⁷ ............................................. H04H 5/00
[52] U.S. Cl. ........................................ 381/12; 381/56
[58] Field of Search .................... 381/1, 12, 56; 345/35, 150, 133, 140; 387/58; 84/464 R

[56] References Cited

U.S. PATENT DOCUMENTS

| | | | |
|---|---|---|---|
| 4,577,188 | 3/1986 | Inami et al. | 340/721 |
| 4,648,113 | 3/1987 | Horn et al. | 381/1 |
| 4,691,358 | 9/1987 | Bradford | 381/12 |
| 4,768,086 | 8/1988 | Paist | 381/56 |
| 4,908,868 | 3/1990 | McTaggart | 381/12 |
| 5,191,620 | 3/1993 | Lee | 381/105 |
| 5,241,302 | 8/1993 | Thong . | |
| 5,247,864 | 9/1993 | Konishi | 84/477 R |
| 5,272,756 | 12/1993 | Tanaka et al. | 381/12 |
| 5,528,255 | 6/1996 | Hagimori | 381/56 |
| 5,619,220 | 4/1997 | Tomita et al. | 345/14 |
| 5,812,688 | 9/1998 | Gibson | 381/119 |

FOREIGN PATENT DOCUMENTS 0 531 965   3/1993   European Pat. Off. .

OTHER PUBLICATIONS

Jones, David E. L., Audio Signal Frequency and Phase Comparator, New Electron (GB) vol. 14, No. 21, p. 25, Oct. 1981.

*Primary Examiner*—Vivian Chang
*Assistant Examiner*—Xu Mei
*Attorney, Agent, or Firm*—Frommer Lawrence & Haug, LLP; William S. Frommer

[57] ABSTRACT

Apparatus for analyzing audio signals from a stereo pair of audio channels, comprises: means for detecting the magnitudes of the audio signals of the two audio channels; first detector for detecting a degree of phase correlation between the audio signals of the two audio channels; and second detector for generating an indicator color for display in respect of the audio channels at a time of test, the indicator color having a hue, intensity and/or saturation dependent on at least the relative magnitudes of and the degree of phase correlation between the audio signals of the two audio channels at the time of test.

6 Claims, 6 Drawing Sheets

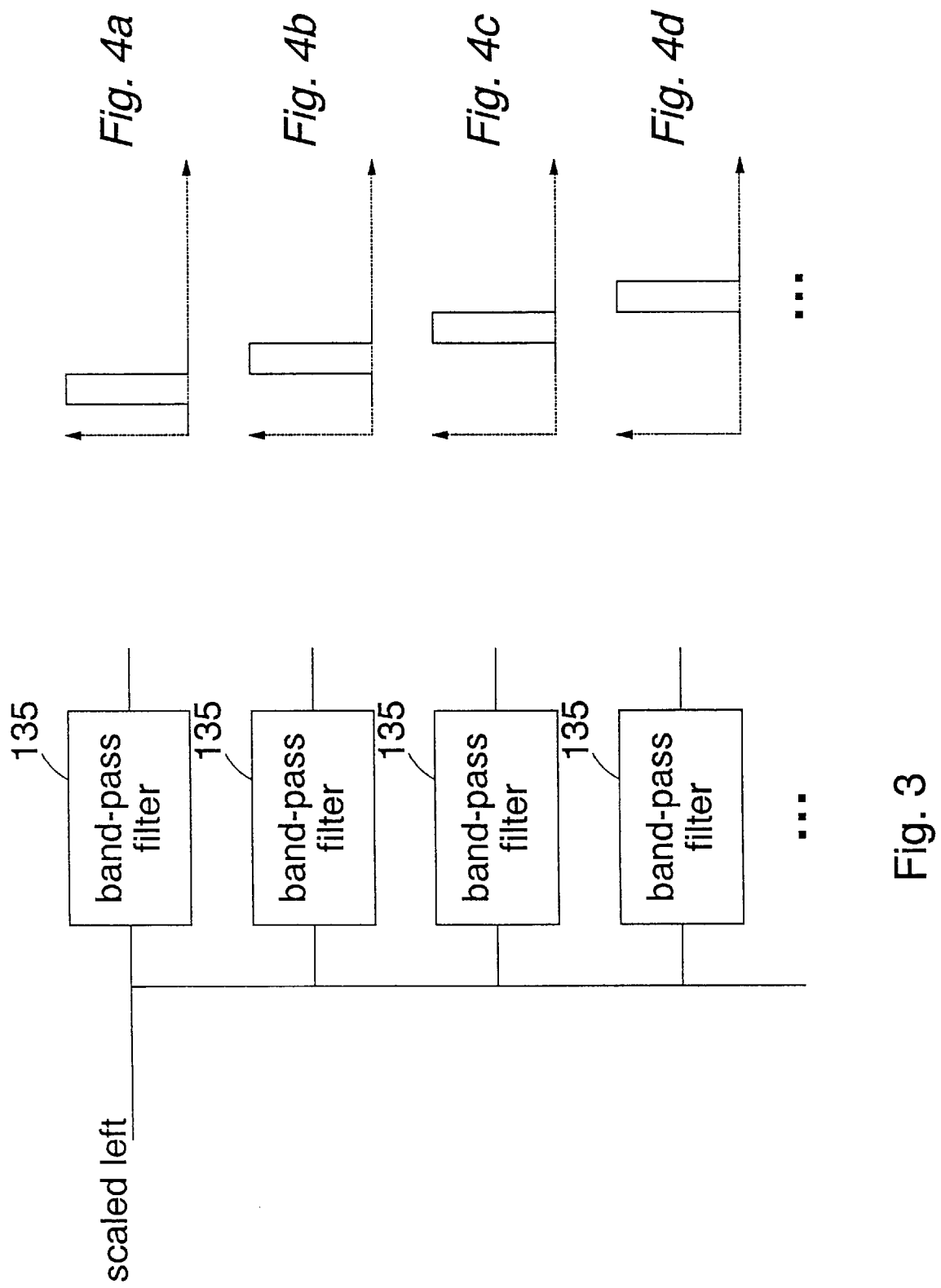

MSB           LSB
| right | left | front | back |
*Fig. 6*
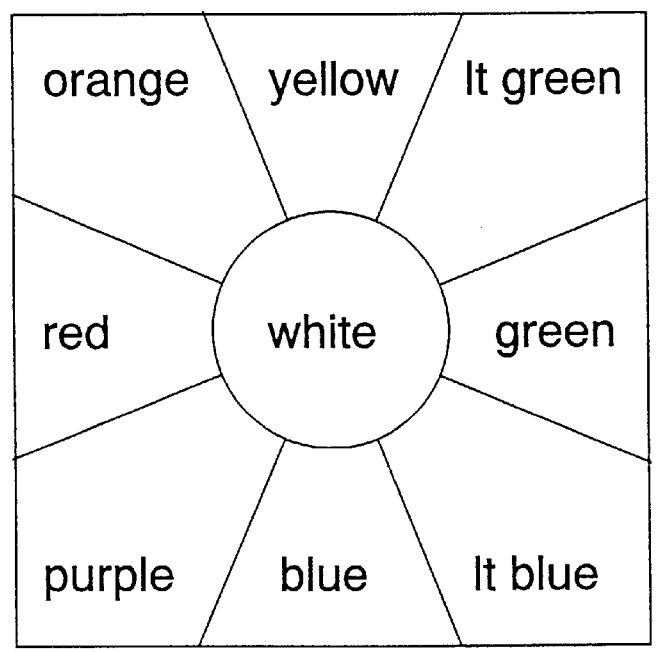
*Fig. 7a*
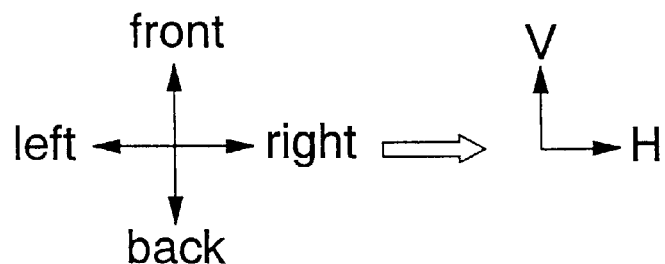
*Fig. 7b*

ANALYSIS OF AUDIO SIGNALS

BACKGROUND OF THE INVENTION

1. Field of the Invention

This invention relates to analysing audio signals.

2. Description of the Prior Art

Several techniques have been proposed for showing, on a visual display, various technical features of an audio signal.

One previously proposed technique is the so-called "voice print". A typical "voice print" represents a monophonic sound by a two dimensional image on a computer screen, paper print or cathode ray tube display.

A horizontal axis is used to represent time, with the earliest on the left and the latest (or most recent) time on the right. A vertical axis is used to represent frequency, with lowest frequencies at the bottom and highest at the top.

It is usual for the vertical axis to be on a logarithmic scale, i.e. equal vertical distances representing octave differences in frequency. The intensity of the image at each point represents the intensity of the sound at the appropriate frequency and time. The amplitude to intensity mapping used is usually logarithmic, i.e. changes in the decibel (dB) value correspond to changes in intensity. Depending upon the type of display used (paper printout or screen display) louder sounds may be represented by a darker or lighter image element. Images may be either a static "snap-shot" of a sound over a number of seconds, or may be continuously generated in real time either onto a roll or paper, or scrolling across a screen.

Voice print images have been in use for over 40 years, maybe much longer. However, they use essentially a monophonic technique. If the technique is to be used with a stereo signal, then either a separate voice print has to be produced for each channel, or the two channels have to be combined so as to produce a single audio signal whose time-dependent intensity can then be mapped onto the voice print. Neither of these solutions then gives any indication of the relative phase of the stereo channels.

Another previously proposed technique which allows the relative phase of a stereo pair to be displayed graphically is the so-called "phase-scope" display.

In this device the left and right parts of a stereophonic signal are displayed on an oscilloscope screen such that the left signal displaces the spot upwards along an axis from the bottom right comer to the top left comer of the display and the right signal displaces the spot upwards along an axis from the lower left comer to the top right corner of the display. Given this arrangement the "phase-spot" displayed on a phase scope may differentiate between the following signals:

SILENCE: Stationary spot in centre of screen.
LEFT only: Line from bottom right to top left.
RIGHT only: Line from bottom left to top right.
FRONT[1]: Vertical line
BACK[2]: Horizontal line
ORTHOGONAL[3]: Central elliptical/circular display.
RANDOM[4]: "Ball of wool" central display.

[1] Left and right of equal amplitude and in phase
[2] Left and right of equal amplitude and out of phase (here, it is appreciated that the "back" is not strictly correct, but it is used throughout this description as a useful term to distinguish out-of-phase signals from in-phase or "front" signals).
[3] Similar sinusoidal left and right signals with 90° phase difference
[4] Uncorrelated left and right signals However, although the phase scope provides useful graphical information about the relative phases of the left and right channels, the "phase scope" also suffers from a number of disadvantages:

In contrast to the voice print display, the phase scope display is transient and requires that the operator keep an eye on it whenever anything interesting happens to the audio signal under test.

Also, the "phase scope" display works on the aggregate stereo signal, which is usually composed of the outputs of many instruments which have different directional characteristics. This makes it difficult to distinguish the directional information in one signal in the presence of all the others.

SUMMARY OF THE INVENTION

This invention provides apparatus for analysing audio signals from a stereo pair of audio channels, the apparatus comprising:

magnitude detecting means for detecting the magnitudes of the audio signals of the two audio channels;

phase detecting means for detecting a degree of phase correlation between the audio signals of the two audio channels; and means for generating an indicator colour for display in respect of the audio channels at a time of test, the indicator colour having a hue, intensity and/or saturation dependent on at least the relative magnitudes of and the degree of phase correlation between the audio signals of the two audio channels at the time of test.

Audio analysis apparatus according to embodiments of the invention provides advantages of both the "voice print" and the "phase scope" type of display, by allowing the phase and intensity of two stereo audio channels to be displayed, with a displayed "history" showing the temporal variation of these values over a period of time. A further extra feature of at least embodiments of the invention is that the information is split up by frequency band, so that phase effects occurring at particular frequency bands (e.g. effects arising in sound picked up from particular musical instruments) can easily be identified.

BRIEF DESCRIPTION OF THE DRAWINGS

The above and other objects, features and advantages of the invention will be apparent from the following detailed description of illustrative embodiments which is to be read in connection with the accompanying drawings, in which:

FIG. 3 schematically illustrates one channel of a filtering stage of the apparatus of FIG. 1;

FIGS. 4a to 4d schematically illustrate filter responses of band-pass filters in the filtering stage of FIG. 3;

FIG. 6 schematically illustrates an encoded data word output by the encoding stage of FIG. 5;

FIGS. 7a and 7b schematically illustrate a mapping between the encoded data words of FIG. 6 and display colours.

DESCRIPTION OF THE PREFERRED EMBODIMENTS

Figure 1:
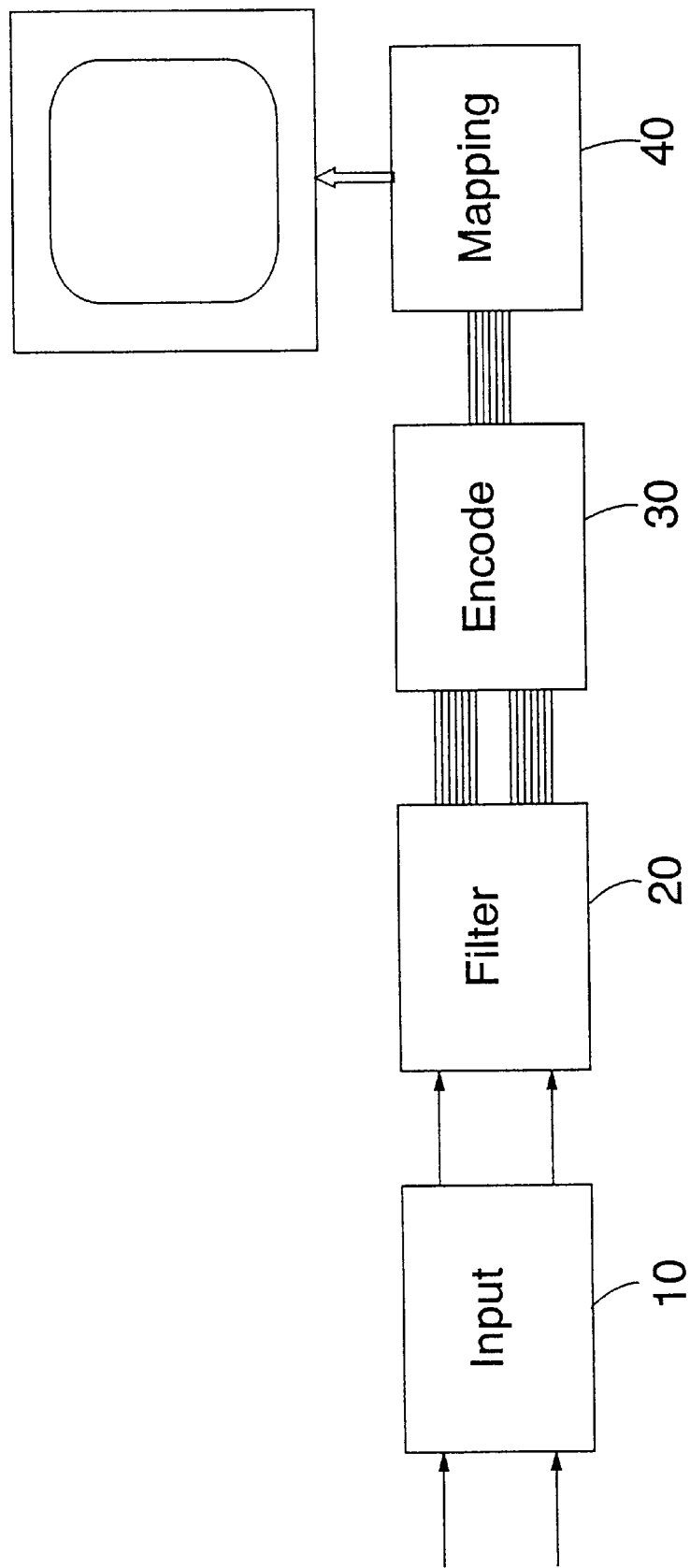
FIG. 1 is a schematic illustration of an audio analysis apparatus.

FIG. 1 is a schematic illustration of an apparatus for audio analysis. The apparatus operates, in some respects, in a similar manner to a standard "voice print", but also uses display colour to display some of the phase information usually represented by the "phase scope".

Referring now to FIG. 1, the apparatus comprises an input stage 10 for receiving audio signals representing left and right audio channels, a filtering stage 20, an encoding stage 30, a mapping stage 40 and a display device 50. The function of each of these stages will be described in detail below with reference to the remaining figures.

Figure 2:
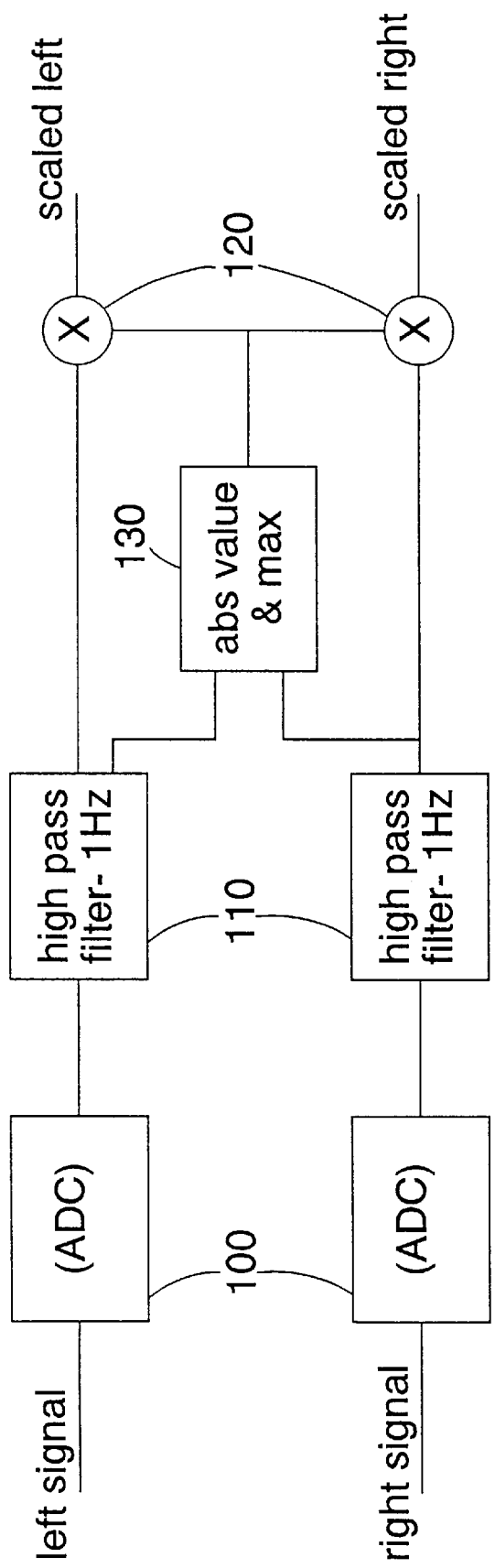
FIG. 2 schematically illustrates an input stage of the apparatus of FIG. 1.

FIG. 2 schematically illustrates the input stage 10 of the apparatus. Audio signals (referred to as "left signal" and "right signal") are supplied, if necessary, to respective analogue-to-digital converters 100. These are used if the input audio signals are in analogue form; clearly, if the input audio signals are in digital form already, there is no need for the analogue-to-digital converters 100.

Digitised left and right audio signals are then supplied to respective high pass digital filters 110, which are arranged to pass substantially all frequencies other than a DC level to remove any DC offset generated by the analogue-to-digital conversion process (wherever in the system that occurred). In the present example, this is achieved by having a high pass filter with a passband of 1 Hz upwards.

The outputs of the two high pass filters are supplied in parallel to a respective pair of multipliers 120 and to an absolute value detector and comparator 130. The absolute value detector generates an absolute value from the output of each high pass filter 110, subject to a fast attack and slow decay function. This unit then detects the maximum of the two absolute values for the left and right channel respectively, and calculates a reciprocal value from this maximum value. The reciprocal value is then multiplied by each of the left and right signals in the multipliers 120. In this way, the two signals are scaled by an amount dependent upon the magnitude of the larger of the two signals, to provide a fast attack/slow decay automatic gain control (AGC).

FIG. 3 illustrates a part of one channel of the filtering stage 20 of the apparatus of FIG. 1.

In particular, in FIG. 3 the "scaled left" signal generated by the left-channel multiplier 120 of FIG. 2 is supplied in parallel to a bank of similar (or identical) "Q" band-pass filters 135. Each of the band-pass filters has a different frequency passband, as shown schematically in the sequence of FIGS. 4a to 4d (where frequency is represented on the horizontal axis and the filtering gain is represented on the vertical axis). The passbands are substantially non-overlapping, and correspond to the different frequency ranges used in the analysis display (see FIG. 8 below).

So, the filtering stage of FIG. 3 outputs, for each audio channel, a set of band-pass filtered signals, one from each of the band-pass filters 135. In this embodiment, there are 61 band-pass filters 135 for each audio channel—6 per octave for ten octaves, including one at each end of the overall frequency range.

Figure 5:
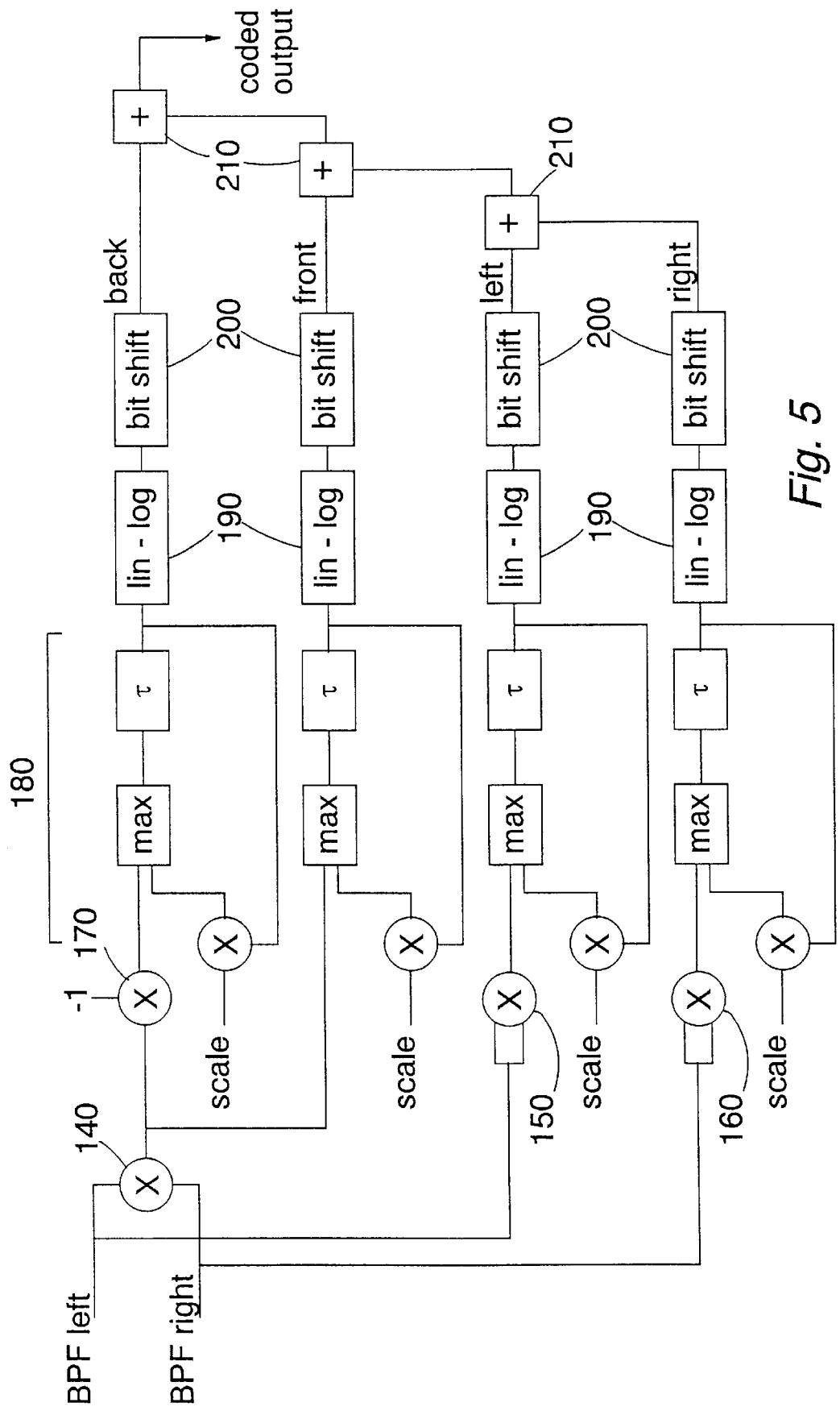
FIG. 5 schematically illustrates an encoding stage of the apparatus of FIG. 1.

FIG. 5 schematically illustrates the encoding stage 30 of the apparatus of FIG. 1. In fact, the components shown in FIG. 5 are replicated, once for each pair of band-pass filters 135 (one left, one right) of the filtering stage 20.

The inputs to the encoding stage 30 are a band-pass filtered left signal from the filtering stage and the band-pass filtered right signal corresponding to the same frequency band.

These two signals are multiplied together in a multiplier 140 to generate a left*right signal. Also, the BPF left signal is squared in a multiplier 150 to generate a left*left signal, and the BPF right signal is squared in a multiplier 160, to generate a right*right signal. The final piece of processing to mention here is that the left*right signal is also negated (by multiplying by −1) in a multiplier 170.

So, at this point in the discussion, the following four signals have been generated:

left*left
right*right
left*right
−left*right.

The left*left signal is a good indicator of the LEFT signal amplitude, similarly the right*right signal is a good indicator of the RIGHT signal amplitude. As described below, a positive peak-following envelope detector (a circuit which tracks and holds, with a defined decay rate, positive-going peaks in the signal) is used so that transient peak effects can be observed.

The left*right signal is largely positive when the left and right signals are in phase (a FRONT signal) and is negative when the left and right signals are out of phase (a BACK signal). Thus in this embodiment a positive peak detector is applied to this (left*right signal) to give a good indicator of the FRONT signal, and a positive peak detector is applied to the −left*right signal to give a good indicator of the BACK signal.

Bearing this in mind, each of the four signals mentioned above is processed by a respective positive peak detector 180 comprising a scaled multiplication stage, a maximum detector and a delay element.

Each of the four output signals from the positive peak detectors is supplied to a respective linear-to-logarithmic converter 190 and from there to a bit shifter 200.

Referring to FIG. 5 and to FIG. 6, the bit shifters 200 shift the numerical outputs of each of the logarithmic converters 190 by differing amounts so that when the four resulting bit-shifted values are added by a cascade of adders to 10, the back, front, left and right signals occupy different bits in a single encoded data word, as shown in FIG. 6.

In particular, assuming (in this example) that a 16-bit encoded data word is used, the right signal occupies the four most significant bits, followed by the left signal, the front signal and finally the back signal occupying the four least significant bits.

This encoding process is not of course essential, but is used simply to provide a convenient data transport technique between the encoding stage 30 and the mapping stage 40.

In the mapping stage 40, the FRONT, BACK, LEFT and RIGHT signals generated (for each respective filter passband) at the encoding stage are mapped into respective display colours.

A number of mappings from filtered stereo signal to intensity, hue and saturation are possible. However, in this embodiment, in order to retain compatibility with a monophonic "voice print" the logarithm of the intensity of the stereo signal is mapped directly to the intensity of the resulting display. The saturation of the display (the "amount" of colour) is controlled by the amount of directionality in the stereo signal. Substantially ORTHOGONAL and RANDOM signals (henceforth referred to generically as CENTRE signals) give zero or very low saturation (producing black, grey or white), whereas strongly LEFT, RIGHT, FRONT or BACK signals produce highly saturated colours.

The selection of which hue to use for which direction is open to multiple interpretations. In some traditional stereo level meters the convention red=left, green=right is used, as this coincides with port and starboard navigation lights used in nautical and aeronautical applications.

Using this as a starting point for LEFT and RIGHT, the FRONT and BACK signals remain to be assigned. In use the FRONT colour should appear to be in some sense a "mixture" between the LEFT and RIGHT colours (since in audio terms it actually is produced by a mixture of the left and right signals), whereas the BACK colour should be distinct (since it is important that unintentionally produced BACK elements in the stereo signal be quickly identified). This embodiment uses yellow for the FRONT signal (which is actually made from red and green in most modern displays) and BLUE for the BACK signal (which is easily distinguished from the other two primaries, red and green).

The combined hue and saturation mappings may be seen thus:

| | FRONT | | | YELLOW | |
|---|---|---|---|---|---|
| LEFT | CENTRE | RIGHT | RED | WHITE | GREEN |
| | BACK | | | BLUE | |

This mapping is quasi-continuous, within the context of the four-bit quantisation applied to the left, right, front and back signals, in that intermediate values on the LEFT, RIGHT, FRONT, BACK map are translated into intermediate colours on the hue/saturation map.

There are several possible methods of converting the left and right filter output signals into an intensity and a position on the LEFT, RIGHT, FRONT, BACK map. One such method is that once the LEFT, RIGHT, FRONT, BACK signals (left*left, right*right, left*right and -left*right) have been generated, an H (horizontal) signal is produced from (RIGHT-LEFT), and a V (vertical) signal is produced from (FRONT-BACK). These H and V signals are used to select the appropriate position in a read-only memory (ROM) containing the hue/saturation map table.

This process is illustrated schematically in FIGS. 7a and 7b. FIG. 7a illustrates the hue/saturation table with reference to the four signal directions (FRONT, BACK, LEFT, RIGHT) of FIG. 7b, as transformed to the H and V axes. The ROM containing the table is simply a look-up table of palette values to drive a video display, so that for each pair or (H, V) values (used as ROM addresses), a respective set of hue, saturation and intensity values is defined and stored at that address.

The mapping operation is performed repeatedly for each frequency band (defined by each left-right pair of band-pass filters). Starting at the centre of the mapping table (for CENTRE signals) the hue is white and the saturation is very low. The intensity which is displayed increases with increasing amplitude of the CENTRE signal. Moving away from the centre in a particular direction defines a hue other than white (e.g. orange), and the displacement from the centre defines the saturation—further from the centre of the table corresponding to higher saturation. The intensity of the colour to be displayed for that frequency band is proportional to or otherwise dependent on the amplitude of the signal in that frequency band.

The amplitude (for use in mapping an intensity value) could be measured as, for example, the sum of the two signals left+right.

The mapping is performed for each of the frequency bands, at regularly spaced time intervals, using, on each occasion, the latest available signal values from the encoding stage 30. The resulting colour (hue, saturation, intensity) for each frequency band is then displayed at a vertical screen position dependent on the frequency of that band, and at a horizontal position dependent on the time at which the mapping took place.

Figure 8:
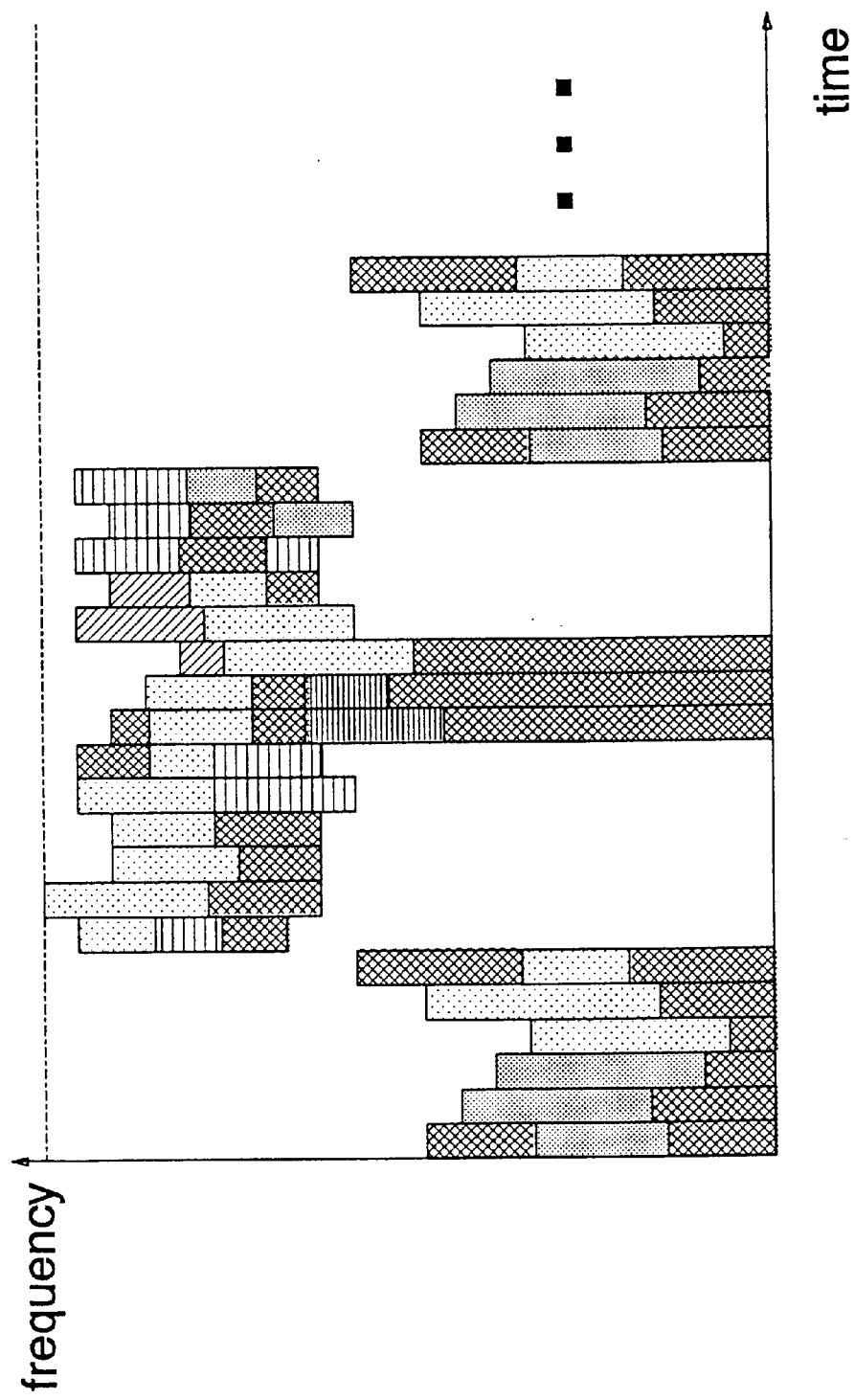
FIG. 8 is a schematic representation of a screen display generated by the apparatus of FIG. 1.

FIG. 8 is a schematic representation of a screen display generated by the apparatus of FIG. 1.

In FIG. 8, time is represented along a horizontal axis from left (least recent) to right (most recent). Frequency is represented along a vertical axis, split into 61 frequency bands. In reality, there would be one band for each left-right pair of band-pass filters 135, but for simplicity of the drawing only a relatively small number of bands are illustrated.

Some areas are shown shaded in various shades of grey. Within the formal restrictions placed on patent drawings, these shades are intended to represent the different hues, intensities and saturations assigned to those frequency bands at those times by the filtering and encoding stages.

So, following along the same horizontal level of the display from left to right, it is possible to see the signal content and channel phase at a particular frequency band, over time. (Often a particular frequency band or small group of bands might contain mainly signals from a particular sound source—such as a drum at low frequencies or a trumpet over an octave or so at relatively high frequencies). Looking in the vertical direction at a particular time instant (a particular point on the horizontal axis) it is possible to see where in the frequency spectrum the audio energy is concentrated, and the relative phase of the two channels at each frequency.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for analysing audio signals from a stereo pair of audio channels, said apparatus comprising:

(i) magnitude detecting means for detecting the magnitudes of said audio signals of said two audio channels;

(ii) phase detecting means for detecting a degree of phase correlation between said audio signals of said two audio channels; and (iii) means for generating an indicator colour for display in respect of said audio channels at a time of test, said indicator colour having a hue, intensity and saturation dependent on at least said magnitudes of and said degree of phase correlation between said audio signals of said two audio channels at the time of test.

2. Apparatus according to claim 1, in which said apparatus is operable to generate successive indicator colours at periodically successive times of test.

3. Apparatus according to claim 2, comprising: for each audio channel, one or more filters for filtering said audio signal of that channel into two or more frequency bands; and in which:

(i) said magnitude detecting means detects the magnitudes of corresponding pairs of frequency bands from said two channels;

(ii) said phase detecting means detects said degree of phase correlation between pairs of frequency bands from said two channels; and (iii) said means for generating an indicator colour generates a respective indicator colours, for display in respect of a frequency band of said audio channels at a time of test.

4. Apparatus according to claim 3, comprising means for displaying said indicator colours on a display screen, each indicator colour being displayed at a screen position dependent on the time of test and the frequency band for which that display colour was generated.

5. Apparatus according to claim 4, in which said screen position for display of an indicator colour has a horizontal screen position dependent on the time of test and a vertical screen position dependent on said frequency band in respect of which that indicator colour was generated.

6. Apparatus according to claim 1, in which said phase detecting means comprises means for detecting the magnitude of a sum of said audio signals of said two audio channels and the magnitude of a difference between said audio signals of said two audio channels.

* * * * *